(12) United States Patent
Yanagiya et al.

(10) Patent No.: US 6,411,231 B1
(45) Date of Patent: *Jun. 25, 2002

(54) ENCODING, DECODING, AND PROBABILITY ESTIMATION METHOD

(75) Inventors: Taichi Yanagiya; Tomohiro Kimura; Ikuro Ueno; Masayuki Yoshida; Fumitaka Ono, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/275,006

(22) Filed: Mar. 24, 1999

(30) Foreign Application Priority Data

Mar. 25, 1998 (JP) .......................................... 10-077248

(51) Int. Cl.$^7$ ................................................ H03M 7/00
(52) U.S. Cl. ......................................... 341/107; 341/52
(58) Field of Search ................................ 341/107, 106, 341/50, 51

(56) References Cited

U.S. PATENT DOCUMENTS

| | | | | |
|---|---|---|---|---|
| 4,168,513 A | * | 9/1979 | Hains et al. ................. | 358/261 |
| 4,633,490 A | | 12/1986 | Goertzel et al. ............. | 375/122 |
| 4,652,856 A | * | 3/1987 | Mohiuddin et al. .......... | 340/347 |
| 4,933,883 A | * | 6/1990 | Pennebaker et al. ......... | 364/554 |
| 5,025,258 A | | 6/1991 | Duttweller ................... | 341/107 |
| 5,059,976 A | | 10/1991 | Ono et al. .................... | 341/51 |
| 5,546,080 A | * | 8/1996 | Langdon, Jr. et al. ....... | 341/107 |
| 6,081,213 A | * | 6/2000 | Hosaka ........................ | 341/107 |

OTHER PUBLICATIONS

Langdon, et. al., "Compression of Black–White Images with Arithmetic Coding", IEEE Transactions on Communications, vol. Com–29, No. 6, Jun. 1981, pp. 858–867.
CCITT Rec. T. 82, (1993 E), pp. 23–45.
IBM Journal of Research and Development, vol. 32, No. 6, pp. 715–840, Nov. 1988.
"Arthmetic Coding", Annex D, ITU–T Recommendation T.81, (1992 E), pp. 54–76.
Witten et al., "Arithmetic Coding for Data Compression", Communications of the ACM, vol. 30, No. 6, pp. 520–540, Jun. 1987.

* cited by examiner

*Primary Examiner*—Peguy Jeanpierre
(74) *Attorney, Agent, or Firm*—Leydig, Voit, & Mayer, Ltd.

(57) ABSTRACT

In an adaptive probability estimation method, an index referring to coding parameters is determined according to occurrence probabilities of symbols from estimated occurrence counts of symbols, thresholds for probability values that determine the probability intervals corresponding to the indexes are set to values that are examined with small operational load, and an index referring to the corresponding occurrence probability is selected without division, using the probability intervals determined by the thresholds for probability values.

11 Claims, 11 Drawing Sheets

T0, T1, T2: Threshold for Probability Values
A0, A1, A2, A3: Probability Representation Value

T0, ..., T7:    Threshold for Probability Values
A0, ..., A8:    Probability Representation Value

ENCODING, DECODING, AND PROBABILITY ESTIMATION METHOD

FIELD OF THE INVENTION

This invention relates to an encoder and a decoder for data signals and, more particularly, to entropy encoding and decoding.

BACKGROUND

Adaptive encoding is a known method of efficiently encoding data signals. An adaptive encoding device encodes a data signal while studying the occurrence probability of the object of encoding or decoding. Therefore, adaptive coding avoids decreased coding efficiency.

Figure 12:
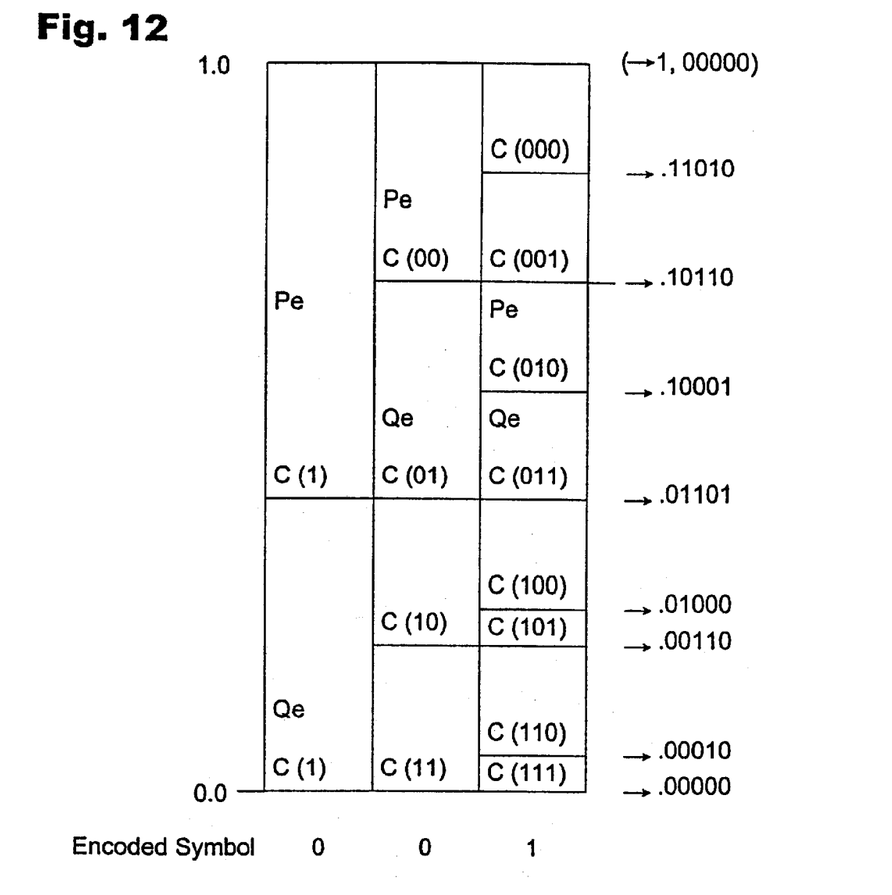
FIG. 12 is a diagram illustrating the concept of arithmetic entropy encoding and decoding.

An adaptive encoding and de coding device is described in five articles concerning "Q-coder adaptive binary arithmetic coder", and appearing in IBM Journal of Research and Development, Vol. 32, No. 6, Nov. 1998, pp. 717–774. In addition, the principle of an arithmetic coder and decoder having an entropy encoding and decoding means is described in U.S. Pat. No. 5,059,976. FIG. 1 of that patent, reproduced here as FIG. 12, illustrates an example in which the binary symbol 001(sequence length 3) is encoded by an arithmetic coder. That encoding is described in the following paragraphs.

In coding a Markov information source, a number line representation coding system is used. In that system a sequence of symbols is mapped on number lines from 0.00 to 1.0 and having coordinates coded as code words which are, for example, represented in a binary expression. FIG. 12 is a conceptual diagram of the number line representation system. For simplicity, a bi-level memoryless information source is shown. The occurrence probability for "1" is set at r and the occurrence probability for "0" is set at 1-r. When an output sequence length is set at 3, the coordinates of each of the rightmost C(000) to C(111), represented as a binary expression, is truncated at the digit that allows distinction from the other, and is defined as its respective code word. Decoding is possible at a receiving side by performing the same procedure as at the transmission side.

In such a sequence, the mapping interval $A_i$, and the lower-end coordinates $C_i$ of the symbol sequence at time i are given as follows:

When the output symbol ai is 0 (More Probable Symbol: hereinafter called MPS), $A_i=(1-r)A_{i-1}$ and $C_i=C_{i-1}$.

When the output symbol ai is 1 (Less Probable Symbol: hereinafter called LPS), $A_i=rA_{i-1}$ and $C_i=C_{i-1}+(1-r)A_{i-1}$.

As described in "An overview of the basic principles of the Q-Coder adaptive binary arithmetic coder", IBM Journal of Research and Development, Vol. 32, No. 6, November 1988, pp. 717–736, in order to reduce the number of calculations, such as multiplication, a set of fixed values are prepared and a certain value is selected from among them, not necessarily calculating $rA_{i-1}$.

That is, if $rA_{i-1}$ of the foregoing expression is set at S, when ai=0, $A_i=A_{i-1}-S$ $C_i=C_{i-1}$ when ai=1, $A_i=S$ $C_i=C_{i-1}+(A_{i-1}-S)$ However, as $A_{i-1}$ becomes successively smaller, S also needs to be smaller, in this instance. To maintain calculation accuracy, it is necessary to multiply $A_{i-1}$ by the second power (hereinafter called normalization). In an actual code word, the fixed value is assumed to be the same at all times and is multiplied by powers of ½ at the time of calculation (namely, shifted by a bit).

If a constant value is used for S, as described above, a problem arises when, in particular, S is large and a normalized $A_{i-1}$ is relatively small. An example follows.

If $A_{i-1}$ is slightly over 0.5, $A_i$ is very small when ai is an MPS, and is even smaller than the area given when ai is an LPS. That is, in spite of the fact that the occurrence probability of the MPS is high, the area allocated to the MPS is smaller than that allocated to the LPS, leading to an decrease in coding efficiency. If it is assumed that an area allocated to the MPS is always larger than that allocated to the LPS, since $A_{i-1}>0.5$, S must be 0.25 or smaller. Therefore, when $A_{i-1}$ is 1.0, r=0.25, and when $A_{i-1}$ is close to 0.5, r=0.5, with the result that the occurrence probability of the LPS is considered to vary between ¼ and ½ during coding. If this variation can be made smaller, an area proportional to an occurrence probability can be allocated and an improvement in coding efficiency can be expected.

Figure 13:
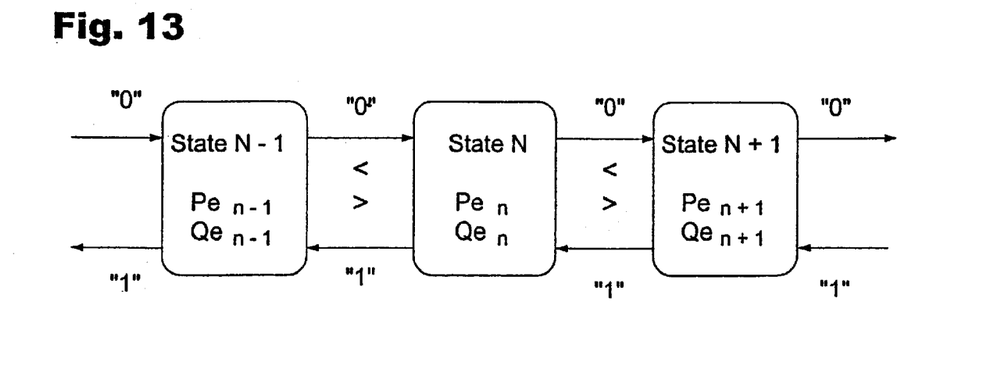
FIG. 13 is a diagram illustrating probability estimation in encoding and decoding.

U.S. Pat. No. 5,025,258 describes a method of calculation of an occurrence probability (Qe) based on the number of times of occurrence. In order to presume the Qe of symbol 1, U.S. Pat. No. 5,059,976 uses learning in the probability estimation means, synchronized with renormalization in the entropy coding means, which is fundamentally independent of the probability estimation means. That is, the adaptability to a change of the information source depends on chance, as indicated in FIG. 13.

Arithmetic coding and decoding are described in the following references:

(1) Langdon et al., "Compression of Black-White Images with Arithmetic coding", IEEE Transactions, Vol. Com-29, No. 6, Jun. 1981, pp. 858–867, (2) U.S. Pat. No. 4,633,490, (3) Witten et al., "Arithmetic coding for Data Compression", Communications of the ACM, Vol. 30, No. 6, June 1987, pp. 520–540.

Figure 11:
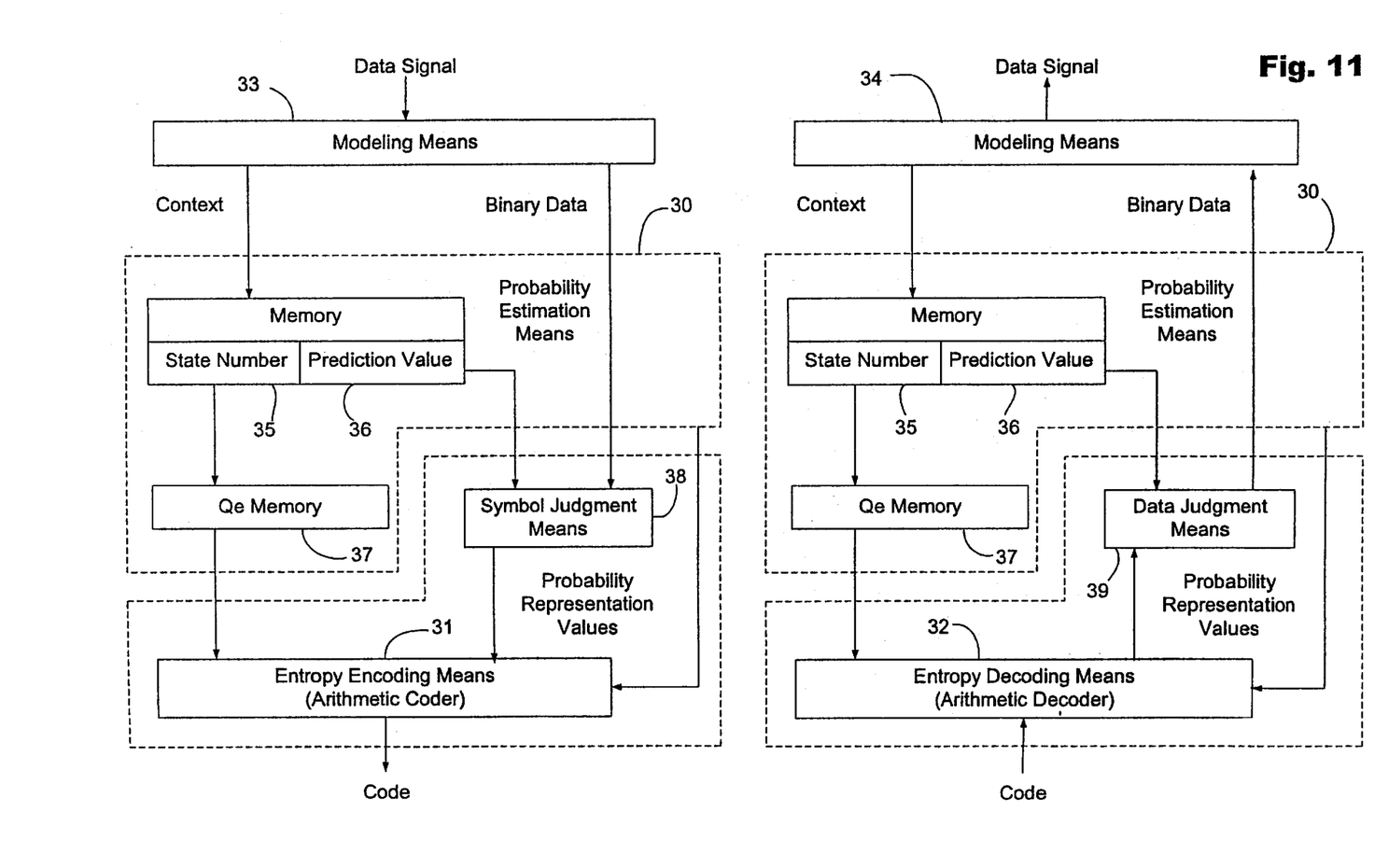
FIG. 11 is a block diagram of coding and decoding methods.

FIG. 11 is a block diagram of an adaptive encoding device and an adaptive decoding device. In FIG. 11, a probability estimation means 30 presumes an occurrence probability of a data value for encoding, and produces a predicted value as a data value with a high occurrence probability. When a multi-value data (not binary data) signal is input, a modeling means 33 analyzes the input signal and classifies it as to context. In the coding device, the modeling means 33 converts the input multi-value data signal into a binary data signal.

In the decoding device, a modeling means 34 analyzes an output signal and classifies it as to context. When a multi-value data (not binary data) signal is output, a modeling means 34 converts the input binary data signal into a multi-value data signal.

In the coding device, a symbol judgment means 38 converts the input data signal into a binary symbol to show agreement or disagreement with the data value for encoding based on the binary data and a predicted value received from a part 36 of a memory as described below. An entropy encoding means 31 encodes the data value output by the symbol judgment means, based on the probability established separately and supplied from the Qe memory 37 described below.

In the decoding device, a data judgment means 39 converts a binary symbol received from an entropy decoding means 32, into binary data based on the binary symbol and a predicted value received from a part 36 of a memory in the decoding device. The entropy decoding is based on the probability separately established and stored in a Qe memory in decoding device.

The structure of FIG. 11 has separate modeling means 33 and modeling means 34 in the encoding and decoding devices. These modeling means may include generally known probability estimation means 30 including data and symbol conversion and inversion function. In the described structure, no conversion and inversion functions in the modeling means 33 and 34 are needed if the modeling means receive binary signals.

A state number is stored into a part 35 of a memory as an index for selecting an estimation probability value (MPS or LPS) for the Qe memory 37. An arithmetic coder and an arithmetic decoder are included in the entropy encoder means 31 and the entropy decoder means 32, respectively. In the encoding device of FIG. 11, the state number memory part 35 receives the context from the modeling means 33. The memory part 36 stores a predicted value 36, based on the context and state number. The Qe memory 37 detects a probability representation value (MPS or LPS). The symbol judgment means 38 produces a binary symbol to establish agreement or disagreement of the data value for encoding based on the binary data and the predicted value. The probability representation value (LPS or MPS) and the binary symbol are sent to the entropy encoding means 31 and the entropy encoding means 31 produces a code in response.

For decoding, the entropy encoding means 31 sends the code to a entropy decoding means 32. The entropy decoding means 32 receives a probability representation value (LPS or MPS) from the Qe memory 37 and the input code. The entropy decoding means 32 produces a binary symbol. A data judgment means 39 receives a predicted value from a part 36 of a memory and the binary symbol from the entropy decoding means 32 and detects binary data based on the binary symbol and the predicted value.

The modeling means 34 receives binary data from the data judgment means 39 and detects a data signal based on the binary data. Moreover, the modeling means 34 converts a multi-value data signal into a binary data signal.

When a multi-value data signal is output, the output data signal is analyzed, and classified as to context, and a multi-value data signal is output. Modeling means 34 converts the binary data signal to decode it. The memory including state number part 35 and predicted value memory part 36 and the Qe memory 37 of the encoding device are the same as on the decoding side. Moreover the memory including parts 35 and 36, the Qe memory 37, symbol judgment means 38, and data judgment means 39 are described in one figure and a flow chart in the articles first mentioned and in TU-T Recommendation T. 82, "Information Technology-coded Representation of Picture and Audio information-Progressive Bi-Level Image Compression", pp. 23–45, 1993.

Conventional adaptive probability estimation methods using state transitions have a problem in that the probability estimation performance is not sufficient because learning in the probability estimation means is synchronized with renormalization in the entropy coding means. The entropy coding means is fundamentally independent of the probability estimation means, so the adaptability to a change in the information source depends on chance.

Conventional adaptive probability estimation methods that estimate occurrence probabilities from occurrence counts of data or symbols have a problem in that division to calculate a probability, and multiplication, to sub-divide a numeric line in arithmetic coding, is necessary and causes a heavy operational load.

SUMMARY OF THE INVENTION

An object of the present invention is to provide an encoding method and a decoding method that determine an index to select an appropriate coding parameter according to an occurrence probability and producing a smaller operational load.

According to one aspect of the invention, a coding method comprises determining a symbol from an input data signal, setting a threshold for probability values that determine a probability interval corresponding to an index based on an occurrence probability of symbols estimated from occurrence counts of the symbols, determining a probability representation value as a coding parameter using the probability interval of the threshold, and coding the symbol determined from the input data signal, based on the probability representation value.

According to another aspect of the invention, a decoding method comprises setting a threshold for probability values that determine a probability interval corresponding to an index based on occurrence probabilities of symbols estimated from occurrence counts of the symbols, determining a probability representation value as a coding parameter using the probability interval of the threshold, decoding an input code based on the probability representation value and outputting a symbol, and determining output data based on the symbol output in decoding of the input code.

According to yet another aspect of the invention, a probability estimation method includes determining a symbol based on an input data signal, setting a threshold for probability values that determine a probability interval corresponding to an index based on occurrence probabilities of symbols estimated from occurrence counts of the symbols, determining the probability representation value for a calculation parameter using the probability interval of the threshold, and outputting the probability representation value.

BRIEF DESCRIPTION OF THE DRAWINGS

The objects and novel features of the invention will more fully appear from the following detailed description when the same is read in connection with the accompanying drawing figures. It is to be expressly understood, however, that the drawing is for purpose of illustration only and is not intended as a definition of the limits of the invention.

DETAILED DESCRIPTION

Embodiment 1

Figure 1:
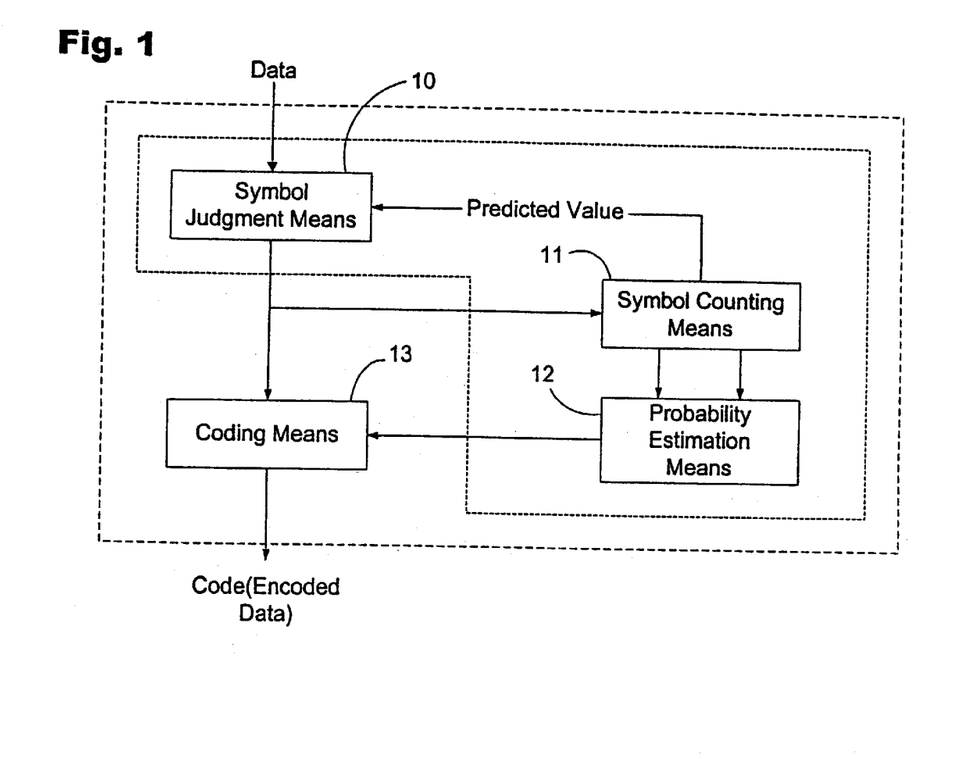
FIG. 1 is a block diagram of an encoding method according to the present invention.

In the invention, adaptive probability estimation is applied to arithmetic coding. FIG. 1 is a block diagram showing the structure of a coding apparatus using arithmetic coding according to the invention. Coding of binary information sources is described for ease of understanding. As in the conventional examples, in arithmetic coding, binary sources are encoded by comparing a symbol to be coded with a predicted symbol and determining whether the symbol is more likely to occur than the another symbol (MPS: More Probable Symbol) or a symbol that is less likely to occur than the other symbol (LPS: Less Probable Symbol). The symbol judgment means 10 determines whether an input symbol is an MPS or LPS. The symbol counting means 11 counts the occurrences of LPS and the occurrences of both the binary symbols, in addition to storing a predicted value. The probability estimation means 12 estimates an LPS occurrence probability according to the accumulated count of LPS occurrences and both the symbols. The coding means 13 arithmetically codes coding input sequences of symbols and outputs coded data. In this coding process an operation of subdividing the numeric line recursively, according to the LPS occurrence probability, and selecting a divided interval that corresponds to the symbol to be coded, is iterated. The symbol counting means 11 can be decomposed into the elements shown in FIG. 2.

Figure 2:
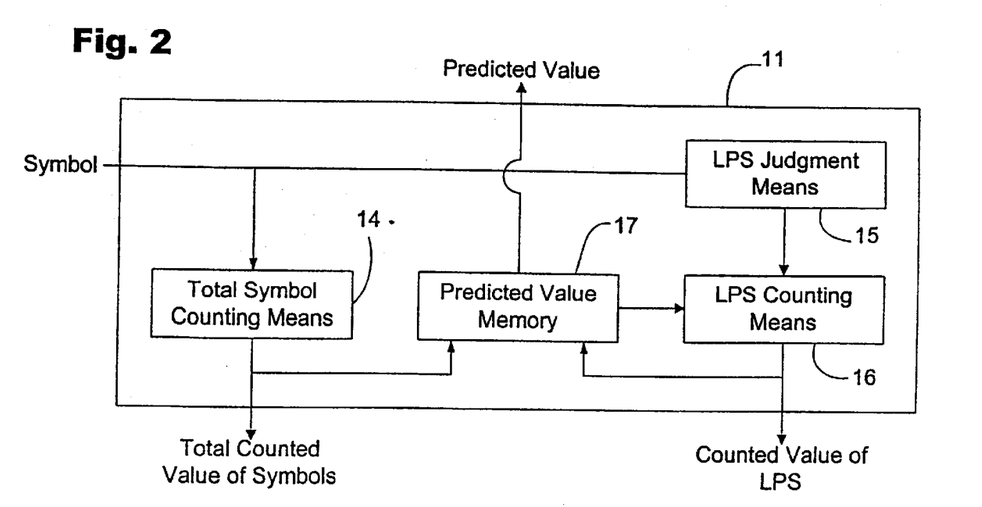
FIG. 2 is a block diagram of a symbol counting means according to the present invention.

In FIG. 2, the total symbol counting means 14 counts occurrences of both the binary symbols and the total occurrence count. The LPS judgment means 15 determines whether the input symbol is LPS or MPS. If LPS, the occurrence will be counted by the LPS counting means 16. The predicted value memory 17 stores the predicted value and, when the LPS occurrence count exceeds half of the total occurrence count, the prediction value is reversed and the LPS occurrence count and MPS occurrence count (the total occurrence count—the LPS occurrence count) are exchanged.

Figure 3:
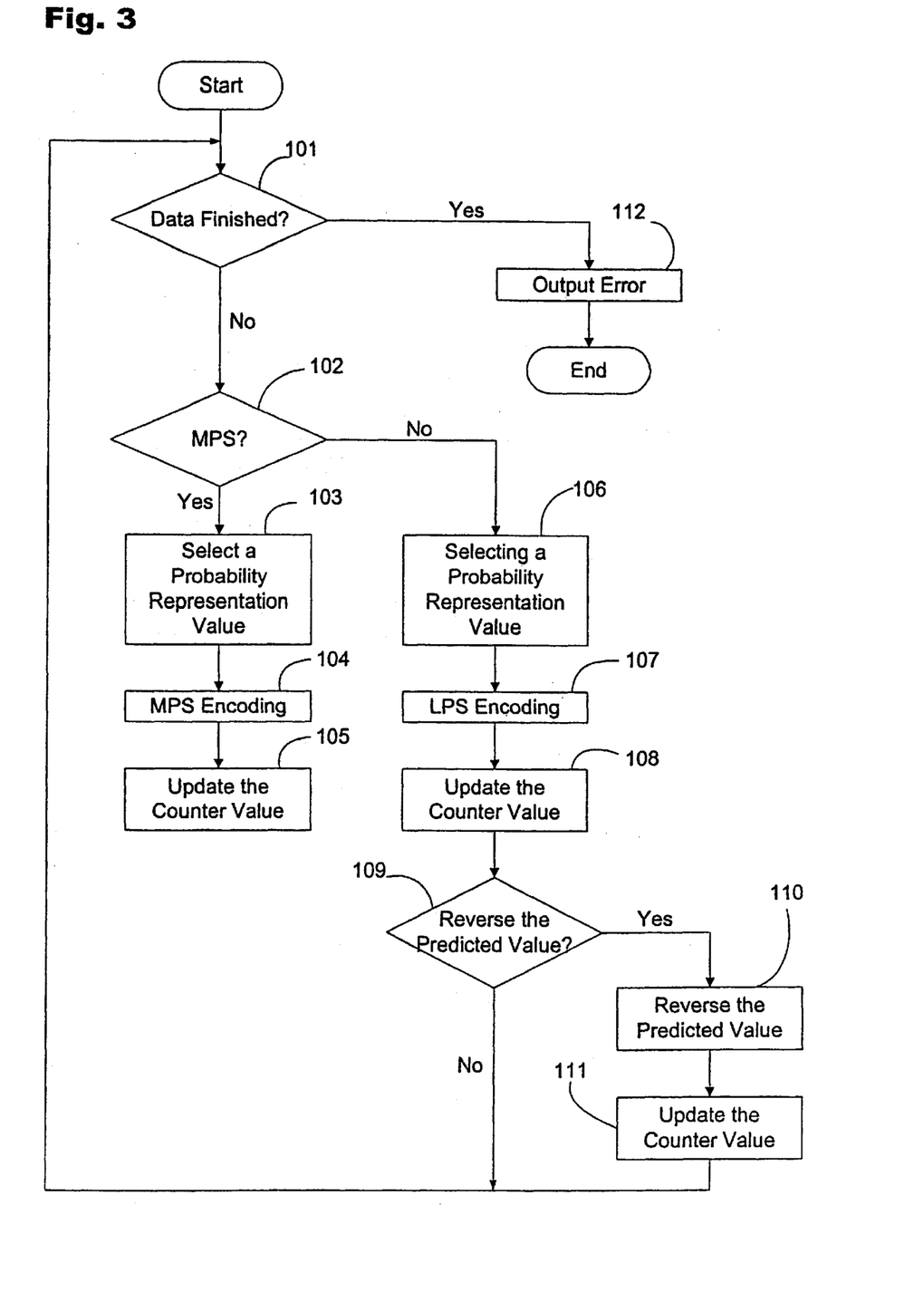
FIG. 3 is a flow chart of an encoding process according to the present invention.

Based on the structure described above, an arithmetic coding method using adaptive probability estimation, according to the invention, is illustrated in FIG. 3. In this method, whether the input symbol to be coded is an MPS or LPS is determined at the symbol judgment means 10 by referring to the predicted value stored at the predicted value memory (Step 102). Then, one of the plural probability representation values prepared in advance is selected in the probability estimation method (explained in detail later) by referring to the LPS occurrence count and the total occurrence count (Steps 103 and 106). An MPS or LPS, determined by the symbol judgment means 10, is encoded by the coding means 13, using the probability representation value selected at the probability estimation means (Steps 104 and 107). After the encoding, the LPS occurrence count and total occurrence count are updated by the symbol counting means 11. When the symbol is determined to be an MPS, the total occurrence count is incremented (Step 105). When the symbol is determined to be an LPS, both the LPS occurrence count and total occurrence count are incremented (Step 108) and, if the LPS occurrence count exceeds half of the total occurrence count, the predicted value is reversed. At the same time, the LPS occurrence count and the MPS occurrence count are exchanged (Step 111), since the LPS occurrence count is larger than the MPS occurrence count (the total occurrence count—the LPS occurrence count). This exchange keeps the LPS occurrence count smaller than half of the total occurrence count.

Figure 4:
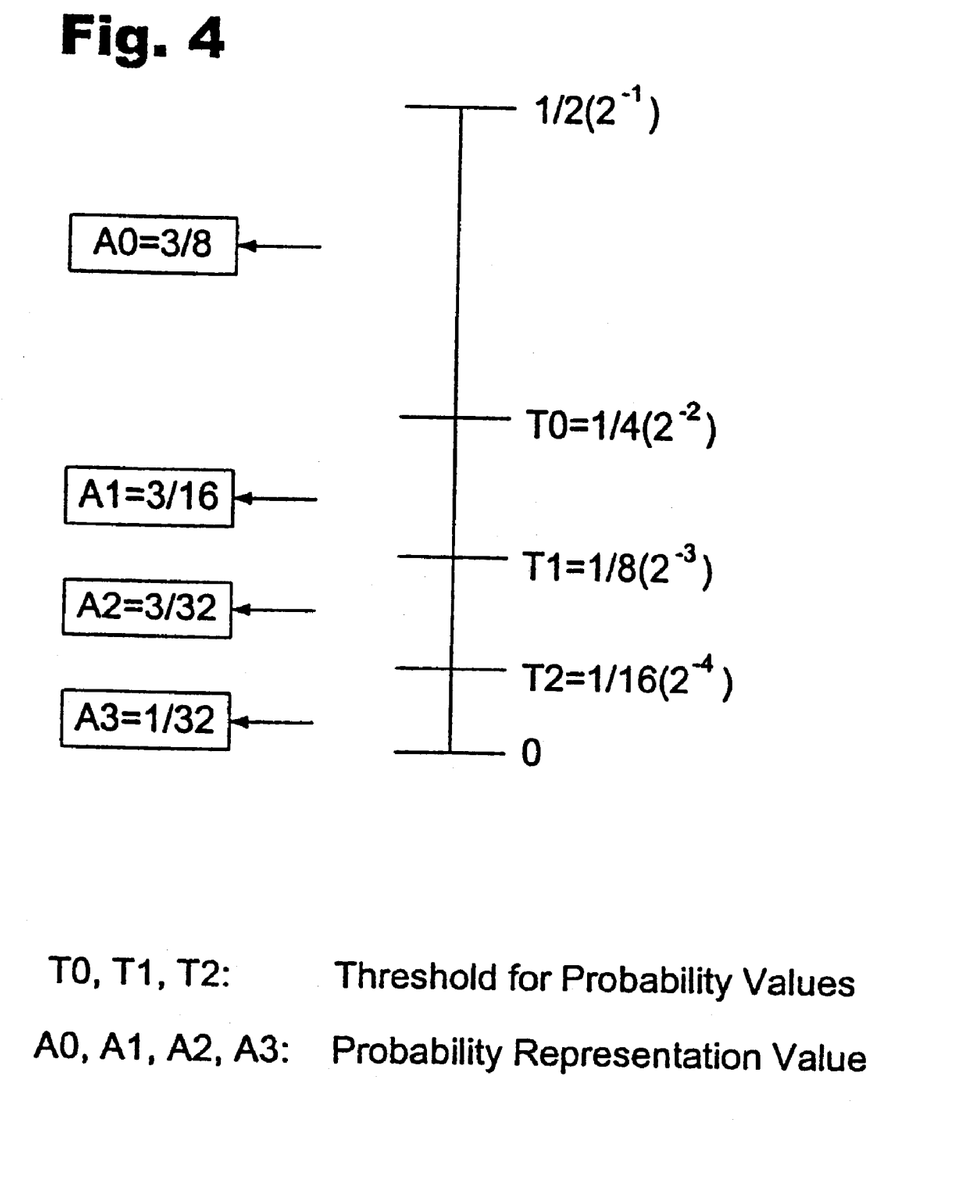
FIG. 4 shows a threshold for probability values and probability representation values for selecting a probability representation value according to an embodiment of the present invention.

The procedure for selecting a probability representation value is now described. FIG. 4 shows thresholds for probability values (T0, T1, T2) and probability representation values (A0, A1, A2, A3) which belong to corresponding probability intervals determined by the thresholds for probability values. Here, the thresholds are set to be powers of two as an example. Each probability representation value can be set to an arbitrary value between two neighboring thresholds for probability values. In this example, each probability representation value is set at the center of two neighboring thresholds of probability values, located between the edges of a respective probability interval. Table 1 shows the thresholds for probability values with the three least significant bits in their binary representation.

TABLE 1

| Threshold for Probability Values | Binary Representation | Bit Arrangement | | |
|---|---|---|---|---|
| | | b0 | b1 | b2 |
| T0 = 1/4 | 0.0100 | 1 | 0 | 0 |
| T1 = 1/8 | 0.0010 | 0 | 1 | 0 |
| T2 = 1/16 | 0.0001 | 0 | 0 | 1 |

Since the thresholds for probability values are set to powers of two, whether an LPS probability is larger than a threshold probability value can be determined by comparing the LPS occurrence count, shifted by some bits, with the total occurrence count.

Figure 5:
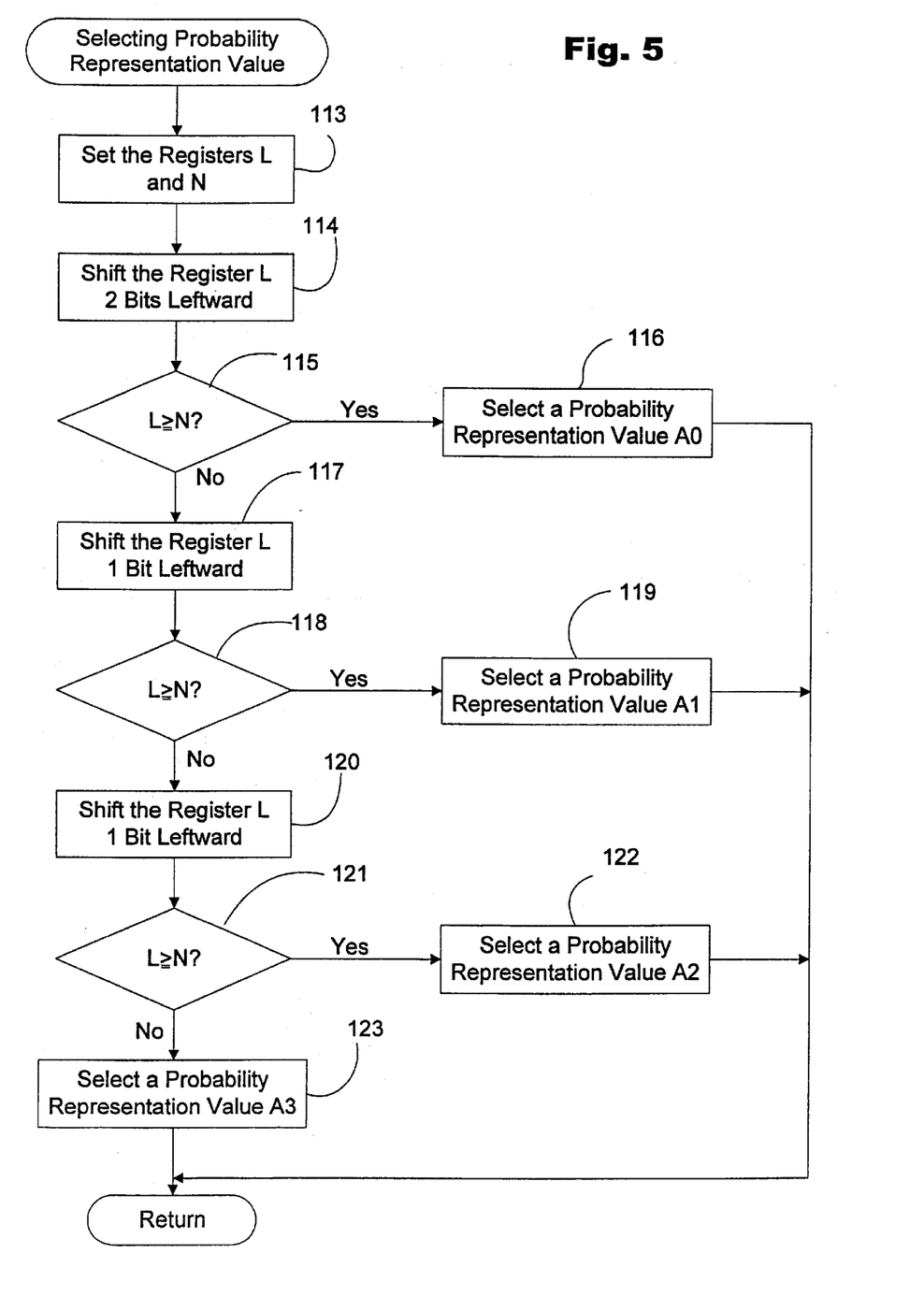
FIG. 5 is a flow chart of selecting a probability representation value according to an embodiment of the present invention.

FIG. 5 shows a procedure for estimating probability. First, the LPS occurrence count and the total occurrence count are stored in the register L and the register N, respectively (Step 113). Then, a comparison to the threshold for probability values T0 is made, that is, the contents of the register L shifted to the left by two bits (Step 114) is compared with the contents of the register N (Step 115).

If L, after shifting by two bits, is greater than or equal to N (the LPS occurrence probability>T0), the probability interval is determined, which means A0 will be selected as a probability representation value (Step 116). If L is still less than N, a comparison to the threshold for probability values T1 is made, that is, the register L shifted to the left by one bit more (Step 117), is compared with the register N (Step 118). If L, after the 3 bit shift, is greater than or equal to N (LPS occurrence probability>T1), the probability interval is determined, which means A1 will be selected as a probability representation value (Step 119). If L, after the 3 bit shift, is still less than N, the comparison to the threshold for probability values T2 is the same as the comparison to the threshold for probability values T1 (Steps 120 and 121). If L is greater than or equal to N (the LPS occurrence probability>T2), the probability interval is determined, which means A2 will be selected as a probability representation value (Step 122). If, after a 4 bit shift, L is still less than N (the LPS occurrence probability<T2), the probability interval is determined, which means A3 will be selected as a probability representation value (Step 123). Thus, by setting the thresholds for probability values to be powers of two, a fast search of the probability representation value corresponding to a probability interval determined by the thresholds for probability values with no division and smaller operational load is made possible.

Embodiment 2

An explanation of the structure and procedure of encoding apparatus using this invention with arithmetic coding is omitted since it is the same as embodiment 1. The procedure for selecting a probability representation value is described below.

Figure 6:
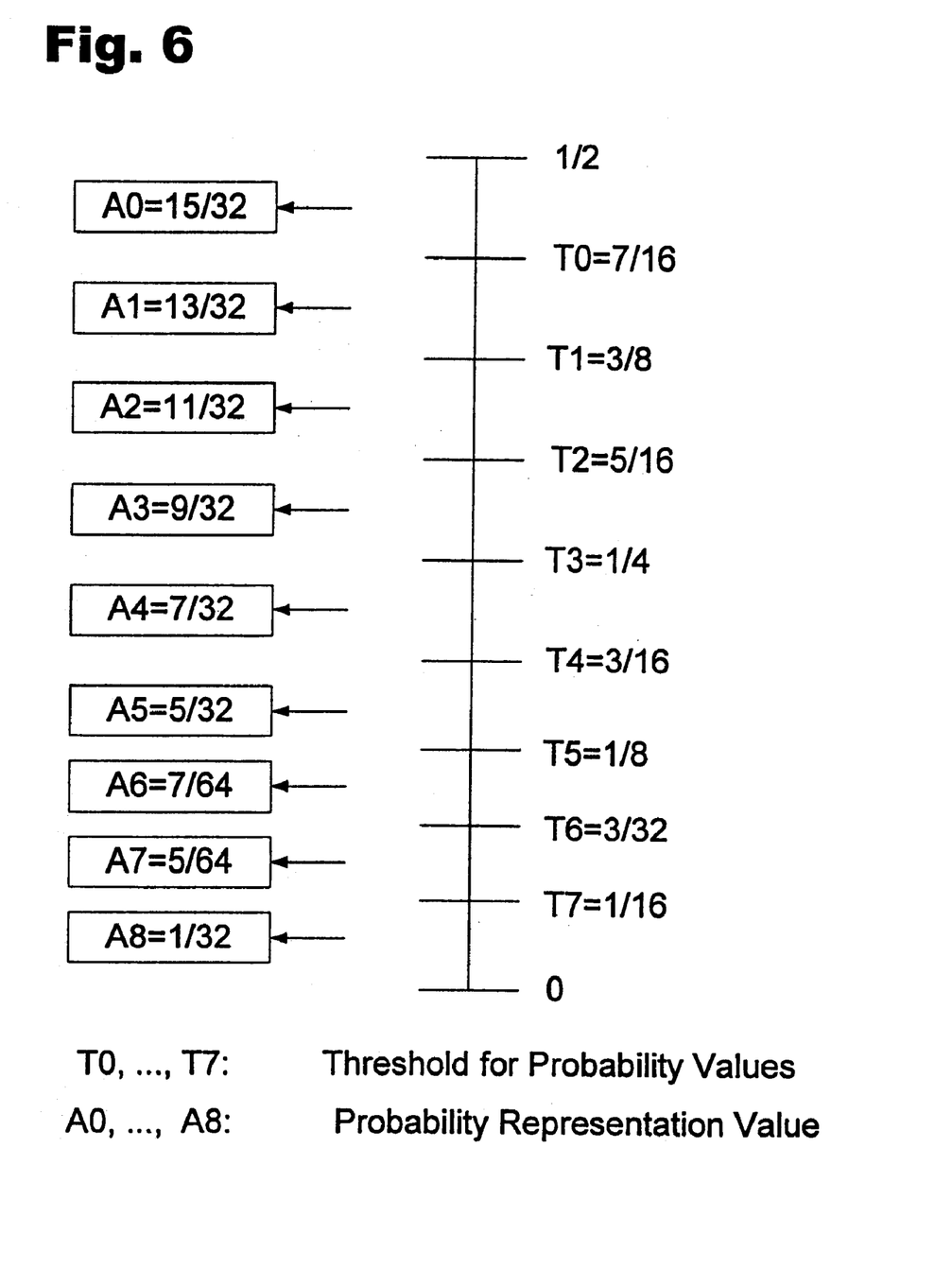
FIG. 6 shows a threshold for probability values and probability representation values for selecting a probability representation value according to an embodiment of the present invention.

FIG. 6 shows thresholds for probability values (T0, T1, . . . T7) and probability representation values (A0, A1, . . . , A8) which belong to the corresponding probability intervals determined by the thresholds for probability values. Here, as an example, the thresholds are set to be powers of two or values obtained by dividing an interval determined by powers of two into two equal parts, recursively. For instance, the interval between ½ and ¼ is divided into four parts (halving the interval twice). The intervals between ¼ and ⅛ and between ⅛ and 1/16 are divided into two parts due to the restriction of binary digit length in this example. Each probability representation value can be set to be an arbitrary value between two neighboring thresholds of probability values.

In this example, each probability representation value is set in the center of two neighboring thresholds for probability values which are located at the edges of each probability interval. Table 2 shows the thresholds for probability values with the four least significant bits in their binary representation.

TABLE 2

| Threshold for Probability values | Binary Representation | Bit Arrangement | | | |
|---|---|---|---|---|---|
| | | b0 | b1 | b2 | b3 |
| T0 = 7/16 | 0.01110 | 1 | 1 | 1 | 0 |
| T1 = 3/8 | 0.01100 | 1 | 1 | 0 | 0 |
| T2 = 5/16 | 0.01010 | 1 | 0 | 1 | 0 |
| T3 = 1/4 | 0.01000 | 1 | 0 | 0 | 0 |
| T4 = 3/16 | 0.00110 | 0 | 1 | 1 | 0 |
| T5 = 1/8 | 0.00100 | 0 | 1 | 0 | 0 |
| T6 = 3/32 | 0.00011 | 0 | 0 | 1 | 1 |
| T7 = 1/16 | 0.00010 | 0 | 0 | 1 | 0 |

Whether an LPS probability is larger than a threshold for probability values can be determined by determining whether each bit is one or zero from the most significant bit to the least significant bit (in the order from b0 to b3), in a binary representation, repeatedly. Whether each bit is one or zero can be determined by comparing the total occurrence count with a value obtained by appropriate shifting or by subtraction (subtraction of the total occurrence count from the LPS occurrence count) of the LPS occurrence count.

Figure 7:
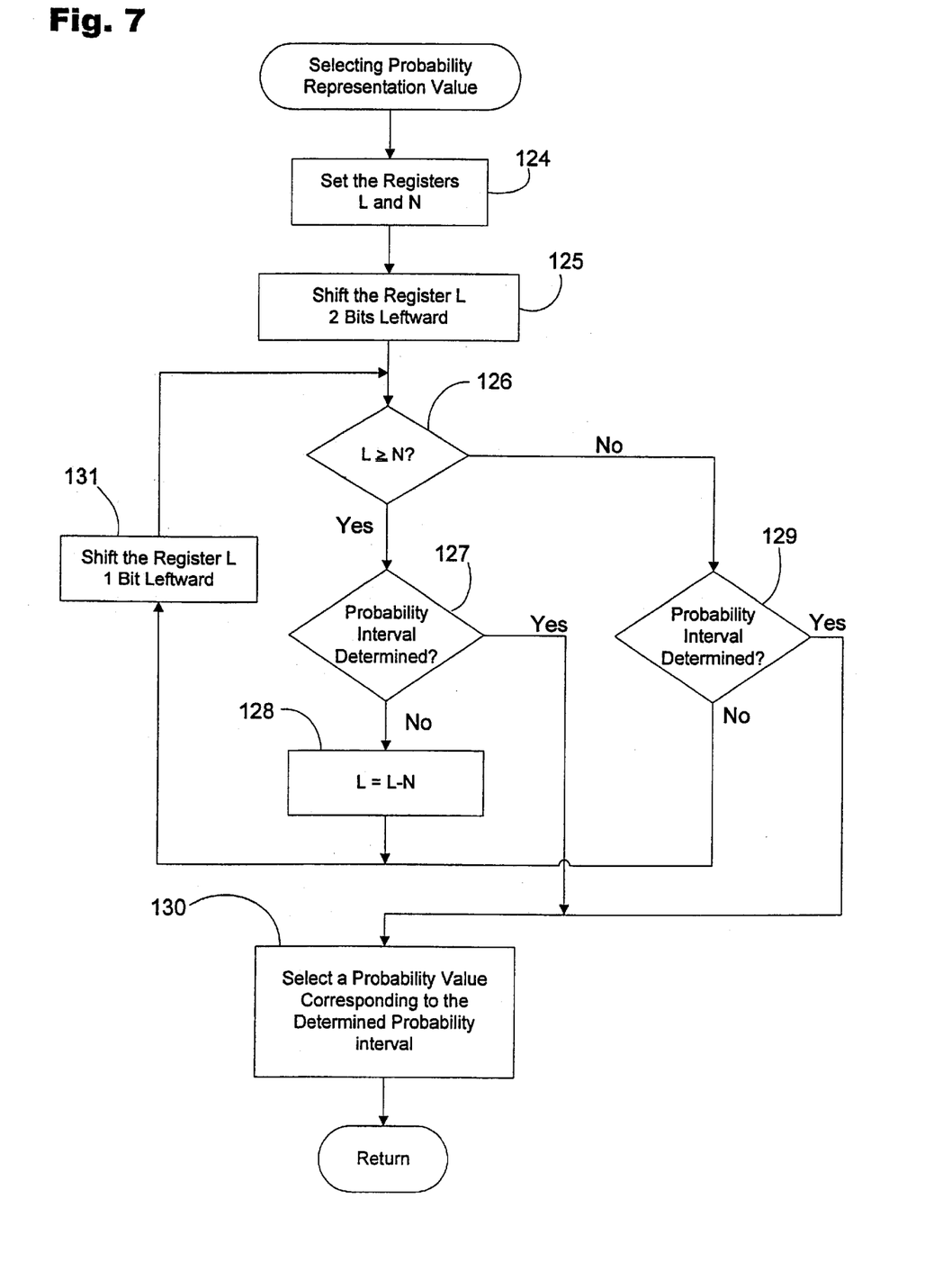
FIG. 7 is a flow chart of selecting a probability representation value according to an embodiment of the present invention.

FIG. 7 shows the procedure for estimating the probability. First, the LPS occurrence count and the total occurrence count are stored in the register L and the register N, respectively (Step 124). Then, the bit b0 in the LPS occurrence count is determined by comparing the contents of the register L shifted to the left by two bits (Step 125) with the register N (Step 126). If L, after the shifting, is greater than or equal to N (the bit b0 of the LPS probability is one: YES at Step 126) and the probability interval is not determined (NO at Step 127), the value of the register N is subtracted from the value of the register L (the bit b0 of the LPS occurrence probability is set to zero: Step 128), and the next bit b1 will be determined. If L is less than N (the bit b0 of the LPS probability is zero: NO at Step 126) and the probability interval is not determined (NO at Step 129), the next bit b1 will be determined.

The procedure for determining the bit b1 in the LPS occurrence probability is described. The register L shifted to the left by one bit (Step 131) is compared with the register N (Step 126). Determining whether each bit is one or zero is the same as the determination of the bit b1. Determination of bits b2 and b3 is in the same manner as the determination of b1. Thus, each bit in the LPS occurrence probability is determined in sequence, and when a probability interval is decided (YES at Step 127 or 129), the iterative judgment is discontinued and the probability representation value corresponding to the probability interval is selected (Step 130).

The following is a practical example in which the LPS occurrence count L=21 and the total occurrence count N=60. First, the bit b0 in the LPS occurrence count turns out to be one, since the comparison between the register L shifted to the left by two bits (L=84) and the register N shows that L≧N. The next bit b1 in the LPS occurrence count turns out to be zero, since the comparison between the register L from which the value of the register N was subtracted (L=24) and shifted to the left by one bit (L=48) and the register N shows that L<N. Then, the bit b2 in the LPS occurrence probability turns out to be 1, since the comparison between the content of the register N shifted to the left by one bit (L=96) and the content of the register N shows that L≧N.

After the operations above, the probability interval has been decided, that is, A2 will be selected as a probability representation value. Thus, by setting the thresholds for probability values to be powers of two or values obtained by dividing an interval determined by powers of two into two equal parts, recursively, a fast search of the probability representation value corresponding to a probability interval, determined by the thresholds for probability values, with no division step and a smaller operation load, is achieved.

Embodiment 3

Figure 8:
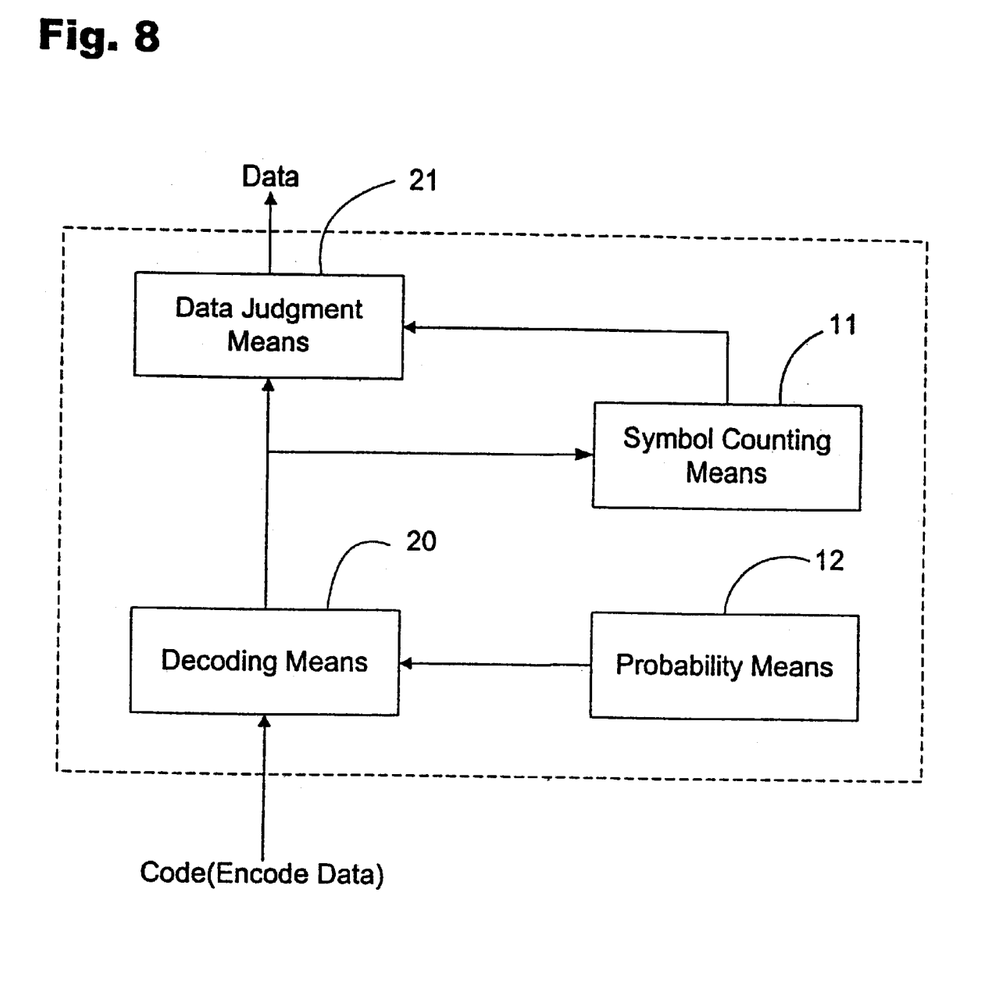
FIG. 8 is a block diagram of a decoding method according to the present invention.

Embodiment 3 concerns a decoding apparatus corresponding to the encoding apparatus introduced in embodiment 1. FIG. 8 is a block diagram showing the structure of a decoding apparatus using arithmetic decoding in accordance with the invention. An explanation of the symbol counting means 11 and the probability estimation means 12 is omitted, since they have been described in connection with the encoding apparatus of embodiment 1. The decoding means 20 outputs symbols by dividing the numeric line according to the LPS occurrence probabilities and determining which symbol the interval indicated by the input code data corresponds to. The data judgment means 21 converts a decoded MPS or LPS into binary data by referring to the predicted value and outputs binary data.

Figure 9:
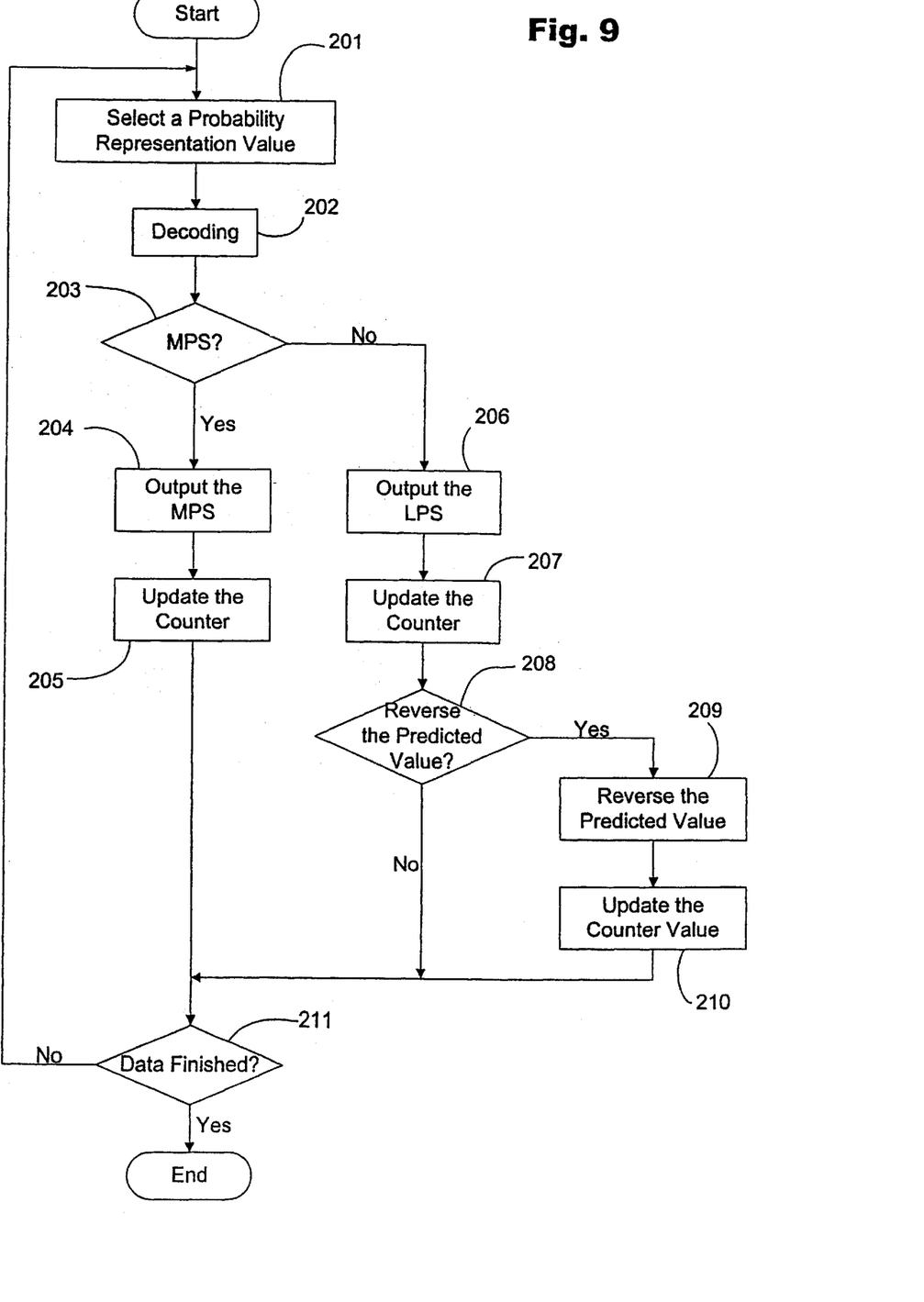
FIG. 9 is a flow chart of a decoding method according to the present invention.

Based on the structure described, a procedure of arithmetic decoding using the adaptive probability estimation according to this invention is illustrated in FIG. 9. One of the plural probability representation values prepared in advance is selected in the probability estimation means 12 by referring to the LPS occurrence count and the total occurrence count (Step 201). Then, an MPS or LPS is decoded by the decoding means 20, using the probability representation value selected by the probability estimation means (Step 202). If the decoded symbol is an MPS, the predicted value stored in the predicted value memory 17 is output by the data judgment means 21 (Step 204). If the decoded symbol is an LPS, the inverse of the predicted value stored in the predicted value memory 17 is output by the data judgment means 21 (Step 206). After outputting the data, the LPS occurrence count and total occurrence count are updated by the symbol counting means 11.

The procedure for selecting probability representation values in this embodiment is the same as in embodiment 1. As in embodiment 1, by setting the thresholds for probability values to be powers of two, a fast search of the probability representation values corresponding to probability intervals determined by the thresholds for probability values with no division and a smaller operational load is made possible.

Embodiment 4

Embodiment 4 concerns a decoding apparatus corresponding to the encoding apparatus of embodiment 2. The structure and procedure of operation of the decoding apparatus using arithmetic decoding according to this invention are the same as those of embodiment 3. Therefore, a description of the procedure for selecting probability representation values is the same as embodiment 2. Therefore, duplicate explanation is omitted. As in embodiment 2, by setting the thresholds for probability values to be powers of two or values given by dividing an interval determined by powers of two into two equal parts, recursively, a fast search of the probability representation value corresponding to a probability interval determined by the thresholds for probability values with no division and smaller operation load, is made possible.

Embodiment 5

In this embodiment, a method for determining one of the coding parameters, a probability representation value, according to two neighboring thresholds for probability values located at both of the edges of a probability interval is described. Here, the probability representation values are determined from the viewpoint of coding efficiency. Generally, coding efficiency for information sources having occurrence probabilities around the center of a probability interval is higher than when the probabilities are close to the thresholds for probability values. That is, the larger the difference from the center of a probability interval, the lower the coding efficiency. The coding efficiency with arithmetic coding that does not use multiplication is lower than arithmetic coding using multiplication, because a fixed-length area is assigned to a symbol to be coded, regardless of the length of the area, which ranges from 0.5 to 1.0 (only the initial length is 1.0). However it allows practical and simple implementation. In this case, at least probability representation values should be corrected. When an occurrence probability of an information source is assumed, the coding efficiency can be measured only by one factor, code length (numerator), since the other factor, entropy (denominator), depends on the occurrence probability.

Figure 10:
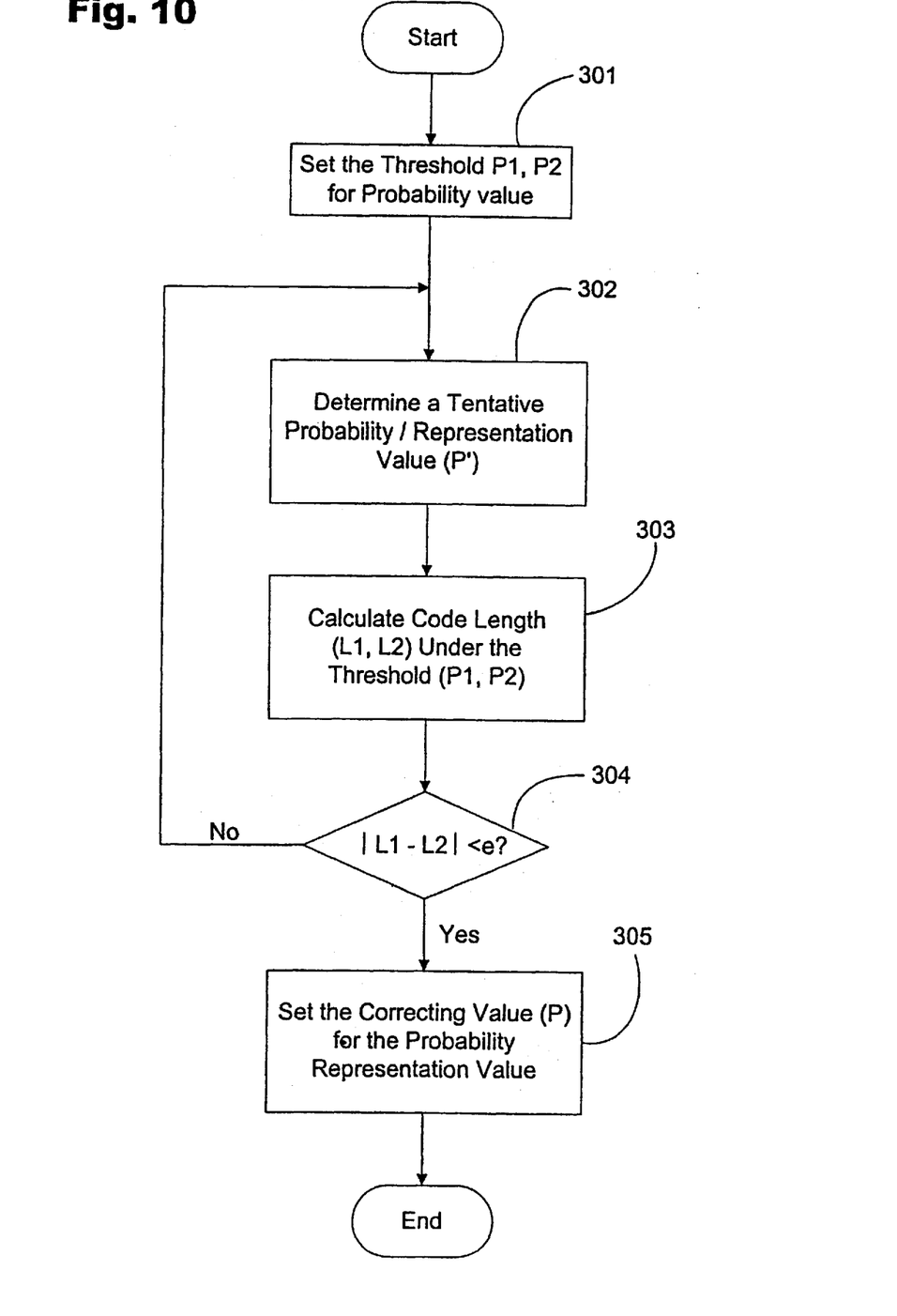
FIG. 10 is a flow chart of a process for correcting the probability representation value of a probability interval according to the invention.

FIG. 10 illustrates an example of a procedure for calculating the correcting values for the probability representation value. First, thresholds for probability values are set (Step 301). At the next step, a tentative probability representation value is set (Step 302). For instance, the initial value can be set to the center of two neighboring thresholds for probability values. Then, code lengths for two information sources with occurrence probabilities at the thresholds for probability values are calculated (Step 303), and the magnitude of the error between the two code lengths is compared with a predefined error tolerance e (Step 304). If the error magnitude is larger than e (NO), the tentative probability representation value is set again. As the tentative probability representation value changes, the code lengths for the two information sources also change. Therefore, in Step 302, in which the tentative probability representation value is set, Step 304 and Step 305 are iterated, and if the error magnitude is smaller than e (YES), the probability representation value is set to the tentative probability representation value, which is supposed to provide the best coding efficiency. For instance, the top of the coding efficiency curve can be a candidate of the value. Using the same technique, the probability representation values for all probability intervals can be determined.

Embodiment 6

As described above, division was necessary to estimate the occurrence probabilities of symbols to be coded with accumulated occurrence counts of symbols. Therefore, the problem was increased complexity upon hardware implementation, and an increased operation load for the coding. The embodiments described include coding methods in which plural probability representation values are prepared in advance, and one of the probability representation values is selected according to the accumulated occurrence counts as an estimated occurrence probability of the symbol to be coded. In the coding method, the thresholds for probability values, i.e., boundaries for the selection of a probability representation value, are determined carefully (for example, powers of two or values obtained by dividing an interval determined by powers of two into two equal parts, recursively), the probability representation value corresponding to a probability interval determined by the thresholds for probability values is selected by shifting, subtraction, and comparison with the accumulated occurrence counts of symbols, and occurrence probabilities of symbols are estimated according to accumulated occurrence counts. A fast search of the probability representation value with no division and smaller operation load is thus made possible. Although a state transition is not used in this probability estimation, each probability interval can be regarded as a state. In the embodiments described, a probability representation value is determined by selecting the corresponding probability interval. This means that an index referring to a probability interval regarded as a state may be selected by a fast search using the occurrence probability with no division and smaller operational load, and the probability representation value is obtained from the index. The index obtained can be easily used not only for selection of a probability representation value, but also for selecting other parameters.

The invention reduces the operational load for coding, which is a reduction in multiplication in the case of a state transition and a reduction of division in the case using accumulated occurrence counts. Also, this invention increases probability estimation fidelity and coding efficiency in a state transition because of the improvement of adaptability to a change of the occurrence probability.

If a state transition is not used, the probability estimation performance will be more independent and improved. In a state transition, learning in the probability estimation means is synchronized with renormalization in the entropy coding means, which is fundamentally independent of the probability estimation means. That is, the adaptability to the change in the information source depends on chance. The probability representation values can be closer to the optimum values due to the way in which the probability representation values are set, so that the coding efficiencies at both edges of a probability interval, which provide the worst coding efficiency in the range, provide the same coding efficiency.

An encoding apparatus and a decoding apparatus according to the invention can be implemented either separately or together. Any medium such as wireless transmission, wire transmission, storage devices using discs, tape, semiconductors memories, and the like can be used as a medium over which code data output from the encoding apparatus are transmitted to the decoding apparatus, or a medium in which code data output from the encoding apparatus are stored. The transmission or storage can be realized electrically, magnetically, or optically.

Embodiment 7

In foregoing embodiments, the probability estimation is used in an encoder structure and a decoder structure. The probability estimation method is used in a calculation means instead of an encoder structure or a decoder structure. The calculation means is connected to the probability estimation structure that determines the probability representation value. The calculation means receives the probability representation value and a binary symbol, makes further calculations based on the probability representation value, and outputs a result sent to another structure. The calculation means can send the calculated result to another structure very quickly because the estimation method is very fast.

What is claimed is:

1. A coding method comprising:

determining symbols in an input data signal, counting occurrences of respective symbols, setting a plurality of probability thresholds that include integer powers of one-half ($2^{-N}$), each adjacent pair of probability thresholds determining a respective probability interval, setting a probability representation value between the probability thresholds for each respective probability interval, determining the probability representation value that approximates an occurrence probability of the symbols based on counted occurrences of respective symbols, in binary form, by iteratively shifting by one bit the counted occurrences of one of the symbols and comparing, after each shifting by one bit, shifted counted occurrences for the one of the symbols to total counted occurrences for all symbols until the shifted counted occurrences at least equals the total counted occurrences, and selecting the probability representation value corresponding to the probability interval having a threshold of $2^{-N}$, where N is the number of bits of the counted occurrences of the symbol shifted until the shifted counted occurrences at least equals the total counted occurrences, whereby the probability representation value is determined without arithmetic division, and coding the symbol based on the probability representation value.

2. The method of claim 1 including using a midpoint of two adjacent probability thresholds to establish another probability threshold.

3. The method of claim 1 including using thresholds obtained by dividing two adjacent thresholds ($2^{-N}$ and $2^{(N+1)}$) into $2^i$ equal parts, where i is a positive integer.

4. The method of claim 1 wherein the symbols are binary symbols.

5. A decoding method comprising:

setting a plurality of probability thresholds that include integer powers of one-half ($2^{-N}$), each adjacent pair of probability thresholds determining a respective probability interval, setting a probability representation value between the probability thresholds for each respective probability interval, determining the probability representation value that approximates an occurrence probability of the symbols based on counted occurrences of respective symbols, in binary form, by iteratively shifting by one bit the counted occurrences of one of the symbols and comparing, after each shifting by one bit, shifted counted occurrences for the one of the symbols to total counted occurrences for all symbols until the shifted counted occurrences at least equals the total counted occurrences, and selecting the probability representation value corresponding to the probability interval having a threshold of $2^{-N}$, where N is the number of bits of the counted occurrences of the symbol shifted until the shifted counted occurrences at least equals the total counted occurrences, whereby the probability representation value is determined without arithmetic division, decoding an input code based on the probability representation value, outputting the input code decoded as a symbol, determining output data based on the symbol, and counting occurrences of respective symbols.

6. The method of claim 5 including using a midpoint of two adjacent probability thresholds to establish another probability threshold.

7. The method of claim 5 including using thresholds obtained by dividing two adjacent thresholds ($2^{-N}$ and $2^{(N+1)}$) into $2^i$ equal parts, where i is a positive integer.

8. The method of claim 5 wherein the symbols are binary symbols.

9. A probability estimation method comprising:

determining symbols in an input data signal, counting occurrences of respective symbols, setting a plurality of probability thresholds that include integer powers of one-half ($2^{-N}$), each adjacent pair of probability thresholds determining a respective probability interval, setting a probability representation value between the probability thresholds for each probability intervals, determining the probability representation value that approximates an occurrence probability of the symbols based on counted occurrences of respective symbols, in binary form, by iteratively shifting by one bit the counted occurrences of one of the symbols and comparing, after each shifting by one bit, shifted counted occurrences for the one of the symbols to total counted occurrences for all symbols until the shifted counted occurrences at least equals the total counted occurrences, and selecting the probability representation value corresponding to the probability interval having a threshold of $2^{-N}$, where N is the number of bits of the counted occurrences of the symbol shifted until the shifted counted occurrences at least equals the total counted occurrences, whereby the probability representation value is determined without arithmetic division, and outputting the probability representation value.

10. The method of claim 9 including using thresholds obtained by dividing two adjacent thresholds ($2^{-N}$ and $2^{(N+1)}$) into $2^i$ equal parts, where i is a positive integer.

11. The method of claim 9 wherein the symbols are binary symbols.

* * * * *